United States Patent [19]

Akahoshi et al.

[11] Patent Number: 4,970,107
[45] Date of Patent: Nov. 13, 1990

[54] COMPOSITE ARTICLE COMPRISING A COPPER ELEMENT AND A PROCESS FOR PRODUCING IT

[75] Inventors: Haruo Akahoshi, Hitachi; Kanji Murakami, Mito; Yoshihiro Suzuki; Akira Nagai, both of Hitachi; Kiyonori Kogawa, Hiratsuka; Akio Takahashi, Hitachiohta, all of Japan

[73] Assignee: Hitachi, Ltd., Tokyo, Japan

[21] Appl. No.: 383,074

[22] Filed: Jul. 21, 1989

[30] Foreign Application Priority Data

Jul. 25, 1988 [JP] Japan .................. 63-183579

[51] Int. Cl.⁵ .................................. B32B 9/00
[52] U.S. Cl. .................................. 428/209; 428/409; 428/457; 428/901; 156/60; 427/96; 430/311
[58] Field of Search .............. 156/60; 428/209, 409, 428/457, 901; 430/311, 313, 315, 316, 318, 319; 427/96

[56] References Cited

U.S. PATENT DOCUMENTS

| | | | |
|---|---|---|---|
| 3,615,737 | 10/1971 | Schneble, Jr. et al. | 106/1 |
| 4,632,852 | 12/1986 | Akahoshi et al. | 427/437 |
| 4,642,161 | 2/1987 | Akahoshi et al. | 156/630 |
| 4,643,793 | 2/1987 | Nakaso et al. | 156/306.6 |
| 4,696,861 | 9/1987 | Tatematsu et al. | 428/328 |
| 4,774,122 | 9/1988 | Adler | 428/156 |
| 4,806,432 | 2/1989 | Eguchi et al. | 428/457 |

FOREIGN PATENT DOCUMENTS 52-79271 4/1977 Japan .
58627594 6/1981 Japan .

Primary Examiner—Patrick Ryan
Attorney, Agent, or Firm—Antonelli, Terry, Stout & Kraus

[57] ABSTRACT

To make a composite article comprising a copper element and an adhesive material adhesively bonded to a surface thereof, the surface of the copper element is provided with knife-shaped elongate projections whose opposite flanks are at an average angle of less than 60° to each other. The knife-shaped elongate projections may include rod-shaped projections much smaller than the knife-shaped projections projecting outwardly from the surface of the knife-shaped projections. The knife-shaped projections may be formed by electroless plating and the rod-shaped projections by oxidation and optionally reduction. Bonding strength is improved.

34 Claims, 2 Drawing Sheets

COMPOSITE ARTICLE COMPRISING A COPPER ELEMENT AND A PROCESS FOR PRODUCING IT

BACKGROUND OF THE INVENTION

1. Field of the Invention

The present invention relates to a composite article comprising a copper element, e.g. a copper printed circuit and an adhesive material, and a process for producing such an article. The invention is particularly, but not exclusively, applicable to a multi-layered wiring circuit board and also is applicable to other articles in which copper is bonded to an adhesive material such as semiconductor chip packages, flexible printed circuits and a tape automated bonding device.

2. Description of Prior Art

In FIG. 1 described in detail below there is shown a conventional multi-layer wiring circuit board. In the manufacture of such a board, individual circuit boards carrying copper wiring layers are laminated in a stack alternately with layers of adhesive material known as prepregs which are cloth layers impregnated with thermosetting polymers. To achieve bonding, the stack is subjected to pressure and heat. The present specification is especially concerned with the bonding between the copper layer and the adhesive material.

U.S. Pat. No. 4,642,161 (JP-A-86-176192) describes a process in which a conventional multi-layer printed wiring board is produced by roughening the surface of a copper circuit layer by an etching treatment, carrying out a "blackening treatment" to form a copper oxide film by oxidation, effecting reduction of the copper oxide and thereafter carrying out lamination and bonding with prepreg layers. In this case, the surface of the copper foil has pit-like recesses having a diameter and depth of from 0.1 to 1.0 $\mu$m, due to etching.

U.S. Pat. No. 4,643,793 (JP-A-86-15981) discloses a method of treating a surface for copper to improve its adhesion to prepreg material. The surface is electrolessly plated by contacting it with an aqueous solution containing (a) copper ions, a chelating agent, a reducing agent, hydroxy ions and water, and (b) a nitrogen-containing heterocyclic compound which colors the surface into a color and gloss other than that of metallic copper. Thereafter the surface is treated with at least one of ammonia water, an aqueous solution of a reducing agent and an acidic solution. It is stated that the treatment by the first solution can form a copper deposition layer having minute particles, needles or cylinders or mixtures thereof. Etching to roughen the surface prior to the electroless printing is described.

U.S. Pat. No. 3,615,737 discloses an electroless metal deposition solution containing a small amount of extraneous ions such as ions of vanadium, antimony, arsenic and bismuth. It is stated that the solution provides enhanced ductility of electroless metal deposits.

U.S. Pat. No. 4,632,852 (JP-A-86-9578 and JP-A-86-38406) discloses a process for electroless copper plating suitable for thick plating in the production of printed circuit boards. Inorganic germanium compounds or silicon compounds are added to the plating solution, and plating is carried out while injecting an oxygen-containing gas into the solution and/or with an oxidizing agent in the solution. It is said that an improvement of the mechanical properties of the plating film are achieved.

JP-A-77-79271 discloses a process for manufacturing a multi-layer printed circuit board, which comprises roughening the surface of desired circuit patterns by plating a patterned copper film by electroless metal deposition and laminating a plurality of the treated printed circuit boards. The adhesion strength between the treated circuit boards can be improved.

The conventional techniques for producing multi-layer wiring circuit boards can obtain sufficiently high bonding strength between a copper circuit and a prepreg resin in the case where known resins such as an epoxy resin, a polyimide resin, and the like are used and can secure high reliability of the printed wiring board.

However, there is a need to improve bonding of the copper to the adhesive. Novel resins exist whose properties such as heat resistance, thermal expansion coefficient and the like are improved permitting high density wiring and high computation speed of the printed circuit but these have low affinity with respect to copper and known techniques cannot obtain sufficiently high bonding strength. Accordingly, sufficient reliability cannot be obtained in the multi-layer printed wiring board.

Secondly, the conventional techniques make the copper surface coarse by etching, but if the etching conditions are not appropriate the circuit is excesively etched locally and the connection reliability of the wiring tends to be reduced.

SUMMARY OF THE INVENTION

One object of the present invention is to provide an article containing copper bonded to an adhesive material, such as a multi-layered printed wiring board, with increased adhesion strength between the copper and the adhesive material.

It is a further object of embodiments of the present invention to provide a process for making such an article in which decrease of the connection reliability of the circuits due to etching is avoided.

Broadly, the present invention in one aspect provides a composite article comprising a copper element and an adhesive material adhesively bonded to a surface of said copper element, wherein the surface of the copper element has knife-shaped elongate projections. The opposite flanks of these projections are at an average angle of less than 60° to each other. The projections extend along the copper surface. This microstructure anchors the copper element to the adhesive.

In another aspect, the invention provides a method of forming the above composite article, with the microstructure of the copper surface as described.

The invention further broadly provides a process of making a composite article having a copper element bonded to an adhesive material, comprising the steps of;

(a) electrolessly plating a surface of the copper element to form thereon a plated copper layer,
(b) oxidizing the plated copper layer,
(c) causing the adhesive material to adhere to the oxidized plated copper layer.

DETAILED DESCRIPTION OF PREFERRED EMBODIMENTS

Figure 1:
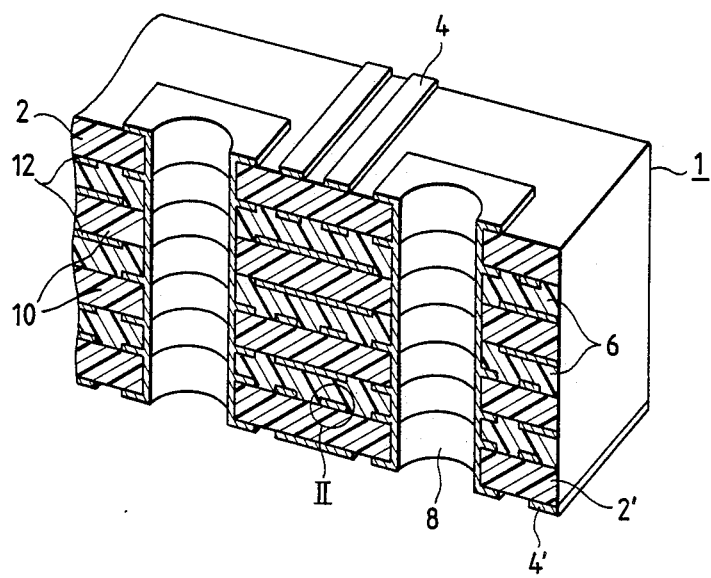
FIG. 1 is a perspective sectional view of a conventional multi-layer wiring circuit board to which the invention may be applied.

The invention will now be further described and illustrated, and preferred embodiments given, with reference to the above drawings.

Since bonding strength between a copper foil and an adhesive depends greatly on the mechanical anchor effect of the interface, the shape of the coarsened copper surface affects greatly the bonding strength.

The present inventors have found that the coarse surface formed by conventional etching has hemi-spherical recesses of at most about 1 $\mu$m in diameter. Even if the etching time is extended, etching proceeds on the entire surface so that it is not easy to attain a high degree of roughening of the surface. Since the roughened surface has recesses approximating hemi-spheres, the effect of the mechanical engagement to the resin is not sufficient. To improve bonding strength by mechanical engagement, the present invention involves formation of projections on the copper surface rather than forming recesses by etching, and the irregularly arranged knife-like projections of the invention are more effective in shape than projections of other shapes such as conical, hemi-spherical, pyramidal and truncated pyramidal. This may be because the contact area is greater between the side surface portions of the elongate projections and the resin, and the peel stress is dispersed. An even better result can be obtained by providing further very small rod-like projections on the knife-shaped projections.

Thus, due to the knife-shaped projection provided on the surface of the circuit layer of copper, the mechanical anchor effect at the interface between copper and the resin can be improved and a printed wiring board with high reliability can be obtained even when a resin having a relatively low affinity with copper is used. Since etching can be omitted, the risk of over-etching a circuit portion can be avoided. Also the profile of the copper wiring element is preserved.

The knife-like projections described above are not obtained by the conventional etching method but can be obtained by depositing copper to the desired shape on the copper circuit surface by plating. It is preferred to use electroless copper plating as the plating method, because a circuit pattern may have independent portions not connected electrically to the exterior. Such portions cannot be electrolytically plated.

The plating conditions and composition must be chosen to achieve the desired surface microstructure.

If the mechanical strength and flexibility of the copper projections are not sufficient, the projections may be broken. Therefore, the composition of the plating solution should be appropriately selected with this in mind also.

Although the electroless copper plating solution disclosed in JP-C-1,085,648, for example, produces electroless copper plating with excellent properties, the shape of the plated surface is pyramidal or truncated pyramidal, and such a surface does not exhibit sufficient bonding strength to the adhesive layer material such as an epoxy resin impregnated prepreg.

As mentioned, the possibility of loss of connection reliability due to local excess etching can be eliminated by forming the projections through plating without carrying out a surface roughening treatment by etching involving removal of material from the surface. Such an effect can be obtained for those resins, such as an epoxy resin, a polyimide resin and the like, whose bonding strength has never been a problem, and when the present invention is applied using these resins, bonding strength between copper layers and the resins can be improved when compared with the prior art technique, and very high reliability can be achieved. Within the invention, light etching to clean and de-fat the copper surface can be employed, prior to the formation of the projections. This does not involve the risk of connection loss.

In some processes within the invention, heavier etching may be used.

To obtain high bonding strength it is preferred to form further fine rod-like projections on the surface of the knife-shaped projections after they are formed on the copper surface. Methods of forming a copper oxide coating film such as a so-called "blackening treatment" and "brown oxide treatment" can be employed as the method of forming such fine projections. The fine projections may alternatively be formed by plating treatment which provides fine surface roughness equivalent to the blackening treatment and brown oxide treatment. Where acid resistance is required for the bonded interface, acid resistance can be improved by reducing the copper oxide coating film to metallic copper by use of a reducing agent. In this case, an amine-borane reducing agent can be suitably used.

Nickel plating, to provide a thin film of nickel on the copper, may be performed after the electroless plating to form the knife-shaped projections or after the oxidation to form the rod-shaped projections.

The height of the knife-shaped projections is preferably at least 0.1 $\mu$m. There is no upper limit to the plating thickness to produce these projections. The greater the plating thickness, the higher the knife-like projections grow and the higher the bonding strength becomes. The upper limit is rather limited by the dimension of the pattern. In particular, the upper limit of the plating thickness is generally from 5 to 10 $\mu$m, for a fine copper pattern width of up to 100 $\mu$m. A preferred range for the height of the knife-shaped projections is 1 to 10 $\mu$m, more preferably 1 to 3 $\mu$m.

When the small rod-shaped projections are formed on the knife-shaped projections, the height of the latter is preferably at least five times, more preferably at least 10 times, the average height of the former. Suitably, the rod-shaped projections, which are elongate, with length greater than width, have an average diameter of 1–50 nm and an average length of 10–200 nm. Preferred average diameter is in the range 5–10 nm and average length in the range 30–100 nm. A round cross-sectional shape is preferred, and the projections may taper.

In the present invention, the adhesive material is typically made of prepreg resins, adhesive sheets or films, adhesive varnishes or adhesive resin pastes.

To form the knife-shaped projections, it is preferred in the invention to use an electroless copper plating solution containing at least one compound of Si, Ge and V or carbonic acid ions.

If a polyalkylene oxide or polyalkylether is added to the plating solution described above, larger knife-shaped projections can be formed in the same plating thickness.

Preferably the electroless copper plating solution used for forming these projections on the copper layer, e.g. circuit patterns, contains one of oxoacid ions of silicon in an amount of 25 to 150 mg/l calculated as Si; oxoacid ions of germanium in an amount of 20 to 100 mg/l calculated as Ge; oxoacid ions of vanadium in an amount of 0.2 to 10 mg/l calculated as V; and oxoacid ions of carbon in an amount of 0.05 to 1.5 mol/l calculated as $CO_3=$.

Examples of compounds added to a plating solution to provide such oxoacid ions are:
- Si: sodium metasilicate, sodium orthosilicate, sodium silicate and water glass.
- Ge: germanium dioxide, sodium germanic acid, germanium dichloride and germanium nitrate.
- V: sodium metavanadate, sodium orthovanadate and vanadium pentoxide.
- $CO_3=$: sodium carbonate, sodium percarbonate and carbon dioxide gas.

Apart from the above additives, the preferred electroless copper plating solutions used for forming the knife-shaped projections are known electroless copper plating solutions which typically contain a water soluble copper salt at a concentration of 50 g/l or less, a reducing agent such as formaldehyde at a concentration of 2 to 10 ml/l, and a chelating agent such as ethylenediamine tetraacetic acid (EDTA) in at least a stoichiometric amount with respect to copper ions, the pH value of the solution being regulated to 11 to 13.

These preferred plating solutions used in the present invention have high selectivity, i.e. they plate selectively on copper, with low tendency to plate on the insulating material. There is therefore a low risk of "bridging" i.e. formation of an unwanted interconnection between wiring parts.

Examples of processes within the invention for forming multi-layered wiring circuit boards are as follows:

(1) Forming circuit patterns on substrate boards—optionally, etching the surfaces of the circuit patterns to roughen them—electroless plating to form knife-shaped projections on the roughened patterns—optionally, nickel plating on the projections—lamination.

(2) Forming circuit patterns on substrate boards—optionally, etching the surfaces of the circuit patterns to roughen them—electroless plating to form knife-shaped projections—oxidizing the surfaces of the knife-shaped projections to provide rod-shaped projections—lamination.

(3) Forming circuit patterns on substrate boards—optionally, etching the surfaces of the circuit patterns—electroless plating to form knife-shaped projections—oxidizing the surfaces of the knife-shaped projections to form rod-shaped projections—reducing treatment of the oxidized surfaces of the knife-like projections—plating the projections with nickel—lamination.

Referring now to the drawings, FIG. 1 is a perspective sectional view of a typical conventional multi-layered printed wiring circuit board, made up of a plurality of double-sided circuit boards 2,2',10 laminated together by prepreg layers 6. Outer layer circuits 4,4' are formed on the outer circuit boards 2,2' and inner circuit patterns 12 on the inner faces of the outer boards 2,2' and the inner boards 10 are bonded to the prepreg layers 6. Copper-lined through-holes 8 provide interconnections between the layers.

Typically the width of the copper wiring elements in the circuits adhered to the adhesive layer is in the range 50 μm to 3 mm, and their thickness is in the range 30 to 50 μm.

Figure 2:
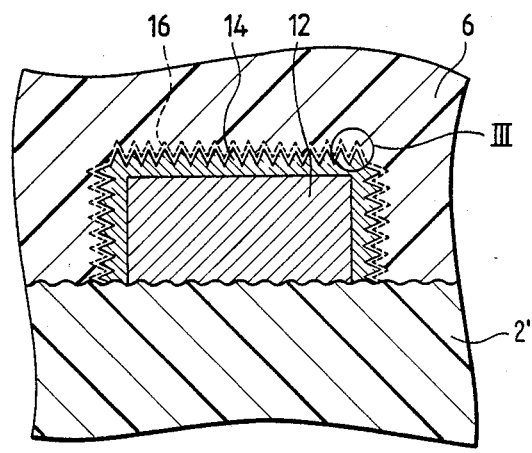
FIG. 2 is an enlarged sectional view of the part II of FIG. 1, illustrating the present invention.

FIG. 2 is an enlarged sectional view of part II of FIG. 1 in an embodiment of the invention. The circuit wiring element 12 is formed on the inner face of outer circuit board 2'. On the wiring element 12 is a layer 14 of electrolessly plated copper having at its outer face knife-like projections. On the knife-like projections is a fine microstructure consisting of rod-shaped projections 16 obtained by reducing an oxide film.

Figure 3:
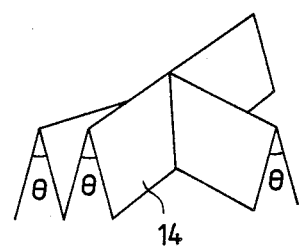
FIG. 3 is a diagrammatic enlarged perspective view of the part III of FIG. 2.
Figure 5:
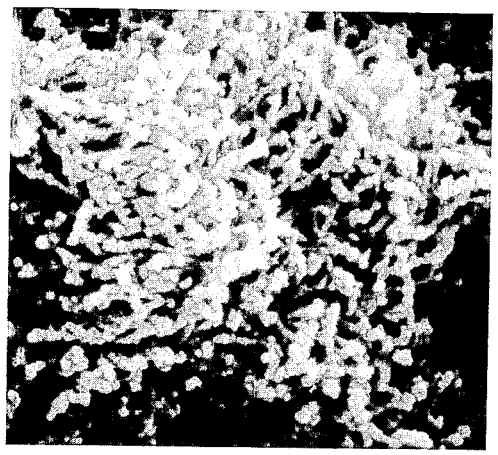
FIG. 5 is a scanning electron microphotograph of the projections on a circuit pattern in the same Example at a later stage.

FIG. 3 is a further enlarged diagrammatic view of the portion III of FIG. 2, showing the nature of the knife-shaped projections on the layer 14. Here the smaller rod-shaped projections are omitted. The angle $\theta$ between the flanks of each knife-shaped projection is less than 60°. These projections are shown in FIG. 3 as having pointed apexes, but in practice their apexes are more rounded. They extend elongately along the surface of the layer 14 and intersect each other in a random manner. This can be seen especially well in FIG. 4, described more below.

Non-limitative examples of the invention will now be given.

EXAMPLE 1

Figure 4:
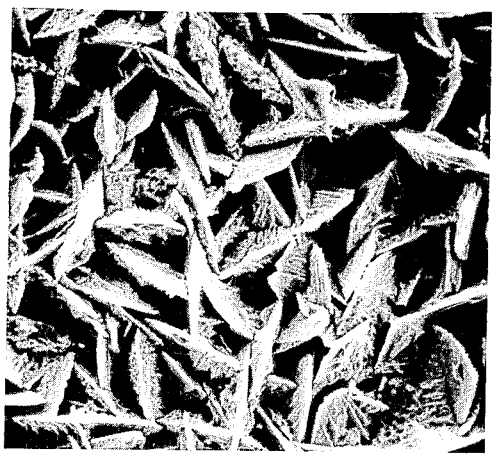
FIG. 4 is a scanning electron microphotograph of the projections formed on a circuit pattern in one Example according to the invention.

Copper of a copper-plated laminated sheet for an inner circuit layer was etched using an etching resist as a mask to form a copper circuit having a predetermined pattern. Next, electroless copper plating was applied to this surface to a thickness of 5 μm using an electroless copper plating aqueous solution having the composition given below and a surface having knife-shaped projections was obtained in which the projections were from 0.1 to 5 μm wide, 5 to 7 μm long and 1.8 μm high and were arranged irregularly as shown in FIGS. 2 to 4.

| Plating solution | |
| --- | --- |
| EDTA.2Na.2H$_2$O | 30 g/l |
| CuSO$_4$.5H$_2$O | 10 g/l |
| GeO$_2$ | 70 mg/l |
| PEG 1000(MW)* | 1 g/l |
| 37% formalin | 2.5 ml/l |
| pH | 12.7 |
| temperature | 72° C. |

(*polyethylene glycol, average molecular weight 1000)

Next, the substrate was dipped into a solution containing 30 g/l of NaClO$_2$, 10 g/l of NaOH and 5 g/l of Na$_3$PO$_4$.12 H$_2$O at 75° C. for 2 minutes to form a copper oxide film on the surface (blackening). The substrate was then dipped into a solution of dimethylamino borane (6 g/l) and NaOH (5 g/l) for one minute to reduce the copper oxide film to metallic copper. This formed rod-shaped projections on the knife-shaped projections. Thereafter, a predetermined number of such substrates were laminated and hot-pressed at 3 MPa and 220° C. for 2 hours to form a multi-layer structure by bonding through prepregs each obtained by imprenating cloth with a resin having the composition below and drying the cloth:

| | |
| --- | --- |
| cresol novolak epoxy-modified polybutadiene | 30 wt % |
| poly (4-vinylbromophenyl) methacrylate | 20 wt % |
| 2,2-di (4-methacrylethoxy-3,5-dibromo phenyl) propane | 50 wt % |
| dicumyl peroxide | 0.5 phr |

| | |
|---|---|
| benzoguanamine | 2.0 phr |
| (Phr: weight ratio per 100 g resin) | |

A multi-layered printed wiring board was then produced by conventional process steps such as drilling through-holes, through-hole plating, formation of an outer layer pattern, and so forth. Bonding strength between the prepreg resin and the copper foil was 0.8 kgf/cm. Substantially the same bonding strength could be obtained when the amount of $GeO_2$ in the plating solution was changed within the range of from 30 to 150 mg/l.

FIG. 4 is scanning electron microphotograph showing the structure of the crystals of the knife-shaped projections formed by the process of Example 1 described above after the electroless plating and before oxidation. The average angle $\theta$ between the flanks of the projections was about 45°.

COMPARATIVE EXAMPLE 1

A multi-layered printed wiring board was obtained in the same way as in Example 1 except that an etching treatment of the copper pattern 12 was carried out by dipping the substrate into an aqueous solution having the composition given below for 1 minute in place of the electroless copper plating in Example 1:

| | |
|---|---|
| $CuCl_2.2H_2O$ | 50 g/l |
| 36% HCl | 500 g/l |
| temperature | 40° C. |

The oxidation and reduction steps of Example 1 were included.

Semi-spherical recesses having a diameter of 0.7 to 1 μm were present on the copper surface after the etching treatment. Bonding strength between the prepreg resin and copper was 0.2 kgf/cm. It was found that an average angle at peaks of the smooth projections left in the copper surface was about 120°.

EXAMPLE 2

A multi-layered printing board was obtained in the same way as in Example 1 except that 1 g/l of $Na_2SiO_3.9H_2O$ was used in place of 70 mg/l of $GeO_2$ in the electroless copper plating solution used in Example 1. Knife-shaped projections 0.8 to 2 μm long and 0.5 μm high were present on the surface after plating, and the bonding strength with the resin was 0.7 kgf/cm. The microstructure of the copper surface of the wiring was the same as in Example 1.

EXAMPLE 3

In place of 70 mg/l of $GeO_2$ in the plating solution of Example 1, 1.5 mg/l of $NaVO_3$ was used. The process was otherwise identical to that of Example 1. The plating time was 2 hours. Knife-like projections 0.8 to 2 μm wide, 5 to 6 μm long and 1.3 μm high were formed on the surface of the copper and the bonding strength to the resin was 0.65 kgf/cm.

EXAMPLE 4

A multi-layered printed board was obtained in the same way as in Example 1 except that an electroless plating solution having the composition shown below was used in place of the plating solution of Example 1:

| | |
|---|---|
| $EDTA.2Na.2H_2O$ | 30 g/l |
| $CuSO_4.5H_2O$ | 14 g/l |
| $Na_2CO_3$ | 30 g/l |
| PEG 600 (Average mol. wt.) | 10 ml/l |
| 37% formalin | 8 ml/l |
| pH | 11.8 |
| temperature | 72° C. |

Knife-shaped projections 0.1 to 0.3 μm wide, 10 to 15 μm long and 0.6 μm high were formed on the copper surface, and the bonding strength to the resin was 0.85 kgf/cm.

The microstructure produced was as in Example 1.

EXAMPLE 5

A multi-layered printed board was obtained in the same way as in Example 1 except that PEG 1000 was removed from the composition used in Example 1. Bonding strength was 0.5 kgf/cm. The microstructure was generally similar.

COMPARATIVE EXAMPLE 2

In the procedure of Example 1 (including the oxidation/reduction treatment), electroless copper plating was conducted including 30 mg/l of 2,2'-dipyridyl in place of 70 mg/l of $GeO_2$ in the copper plating solution of Example 1. The copper surface after plating had the form of a pyramid or truncated pyramid having a side length of 0.5 to 1 μm. Bonding strength between the copper and the resin was 0.1 kgf.cm.

HEAT RESISTANCE TEST

A heat resistance test was conducted by floating the multi-layer printed wiring board produced by the method of Example 1 in molten solder at 260° C. or 288° C. A section of the inner layer circuit portion of the printed boards used as the testpiece was observed through a microscope to examine (1) peeling-off between the inner layer circuit and the resin and (2) cracks of the resin. The result is tabulated in Table 1 below (see Example 6).

It was found after the heat resistance test that cracking of the adhesive resin and peeling between the adhesive resin and the copper patterns did not occur.

EXAMPLE 6

Copper plating was applied to a thickness of 5 μm to the entire surface of a copper foil of a copper laminate sheet intended for an inner wiring layer using a plating solution having the composition set out below. Next, the circuit portion was masked by use of a dry film photoresist and a circuit pattern was formed by etching. After the photoresist on the circuit was removed, a copper oxide film was formed and the reduction treatment of the oxide film was conducted in the same was as in Example 1. Lamination bonding was conducted in the same way as in Example 1 to obtain a multi-layer printed board. A solder heat resistance test was conducted as described above to observe the peel between the inner layer circuit and the resin and the occurrence of cracks. The result is tabulated in Table 1.

The composition of the electroless copper plating solution is:

| | |
|---|---|
| EDTA | 0.08 mol/l |
| copper sulphate | 0.04 mol/l |
| formalin | 3 ml/l |
| sodium metasilicate | 0.75 g/l |
| PEG 600 | 20 ml/l |
| pH | 12.5 |
| temperature | 70° C. |

Since in this example, knife-shaped projections were not present on the side surfaces of the wiring elements of the multi-layer printed wiring board, the peel strength between the copper patterns and the prepreg layers was not so high as in Example 1. Some peeling and cracks occurred at the portion which was subjected to heating in the longer solder resistance tests.

TABLE 1

Result of Solder Heat Resistance Test

| Test condition | | Example 1 | | Example 6 | |
|---|---|---|---|---|---|
| solder temperature (°C.) | float time (s) | peel | crack | peel | crack |
| 260 | 0 | nil | nil | nil | nil |
| | 10 | nil | nil | nil | nil |
| | 30 | nil | nil | yes | nil |
| | 60 | nil | nil | yes | yes |
| 288 | 0 | nil | nil | nil | nil |
| | 10 | nil | nil | nil | nil |
| | 30 | nil | nil | yes | yes |
| | 60 | nil | nil | yes | yes |

In the above experiments, the peel strength was measured in accordance with JIS-C6481 or JIS-C5012.

In accordance with the present invention, a sufficiently high bonding strength can be obtained using conventional adhesive resins which have been used as resins for prepregs and also using novel adhesive resins recently disclosed. It is thus possible to produce a multi-layer wiring board having high reliability.

What is claimed is:

1. A composite article comprising a copper element and an adhesive material adhesively bonded to a surface of said copper element, wherein said surface of the copper element has knife-shaped elongate projections whose opposite flanks are at an average angle of less than 60° to each other.

2. A composite article according to claim 1 wherein said knife-shaped elongate projections further include rod-shaped projections much smaller than said knife-shaped projections projecting outwardly from the surface of said knife-shaped projections.

3. A composite article according to claim 1 wherein said copper element is a copper layer.

4. A composite article according to claim 3 wherein said copper layer is a wiring layer.

5. A composite article according to claim 1 wherein the height of said knife-shaped projections is in the range of 1 to 10 μm.

6. A composite article according to claim 2 wherein the average height of said knife-shaped projections is at least five times the average height of said rod-shaped projections.

7. A composite article according to claim 2 wherein said rod-shaped projections have an average diameter in the range 1 to 50 nm and an average length in the range 10 to 200 nm.

8. A printed circuit having a substrate, a copper wiring layer on the substrate and a layer of adhesive material adhesively bonded to a surface of said copper wiring layer, wherein said surface of said copper wiring layer to which the layer of adhesive material is bonded has knife-shaped elongate projections whose opposite flanks are at an average angle of less than 60° to each other.

9. A printed circuit according to claim 8 wherein said microstructure further includes rod-shaped projections much smaller than said knife-shaped projections projecting outwardly from the surface of said knife-shaped projections.

10. A printed circuit according to claim 8 wherein said adhesive material is a polymer resin.

11. A multi-layer wiring circuit board comprising a plurality of stacked circuit boards, copper wiring layers formed on said circuit boards, and adhesive layers interposed between said circuit boards and bonding the circuit boards into a laminated stack, and adhesive layers being adhesively bonded to surfaces of said copper wiring layers, wherein said surfaces of the copper wiring layers have a microstructure comprising knife-shaped elongate projections whose opposite flanks are at an average angle of less than 60° to each other.

12. A multi-layer printed wiring board according to claim 11 wherein said microstructure further includes rod-shaped projections much smaller than said knife-shaped projections projecting outwardly from the surface of said knife-shaped projections.

13. A process of making a composite article having a copper element bonded to an adhesive material, comprising the steps of
(a) forming on said copper element a surface with knife-shaped elongate projections whose opposite flanks are at an average angle of less than 60° to each other, and
(b) causing said adhesive material to adhere to said surface of said copper element.

14. A process according to claim 13 further including, after step (a) and before step (b), the step of
(c) adapting said knife-shaped elongated projections formed in step (a) by forming rod-shaped projections much smaller than said knife-shaped projections projecting outwardly from the surface of said knife-shaped projections.

15. A process according to claim 13 wherein said step (a) is performed by electroless plating.

16. A process according to claim 15 wherein said electroless plating is performed by means of a plating solution containing an effective amount of oxoacid ions of an element selected from the group comprising Si, Ge, V and C.

17. A process according to claim 16 wherein said plating solution contains a member selected from
(i) oxoacid ions of Si in a concentration in the range of 25 to 150 mg/l calculated as Si
(ii) oxoacid ions of Ge in a concentration in the range of 20 to 100 mg/l calculated as Ge
(iii) oxoacid ions of V in a concentration in the range of 0.2 to 10 mg/l calculated as V
(iv) oxoacid ions of C in a concentration in the range of 0.05 to 1.5 mol/l calculated as $CO_3=$.

18. A process according to claim 16 wherein said plating solution further contains a member selected from the group comprising polyalkylene oxides and polyalkylethers.

19. A process according to claim 14 wherein said step (c) comprises oxidizing the surface of said knife-shaped projections formed in step (a).

20. A process according to claim 19 wherein step (c) further includes performing a reducing treatment of the surface of said knife-shaped projections after the oxidizing thereof.

21. A process of manufacturing a printed circuit comprising the steps of
    (a) forming on a substrate a copper printed circuit layer
    (b) forming on a surface of said copper printed circuit layer a plated copper layer having a surface with knife-shaped elongate projections whose opposite flanks are at an average angle of less than 60° to each other
    (c) causing an adhesive layer to adhere to said plated copper layer.

22. A process according to claim 21 further including, after step (a) and before step (b), the step of
    (d) adapting said knife-shaped elongate projections formed in step (b) by forming rod-shaped projections much smaller than said knife-shaped projections projecting outwardly from the surface of said knife-shaped projections.

23. In a process of manufacturing a multi-layer wiring circuit board, which process includes the steps of
    (a) forming a plurality of wiring circuit boards each having two main faces and a copper printed circuit layer on at least one main face thereof
    (b) stacking said circuit boards with adhesive material layers between their opposed main faces and causing the adhesive material layers to adhere to the circuit boards and the copper printed circuit layers to form a laminated multi-layer wiring circuit board,
    the improvement of forming on a surface of each said copper printed circuit layer which is to become adhered to one of said adhesive material layers, a plated copper layer having a surface with knife-shaped elongate projections whose opposite flanks are at an average angle of less than 60° to each other.

24. A process according to claim 23 which further includes the step of, prior to step (b), adapting said knife-shaped elongate projections by forming rod-shaped projections much smaller than said knife-shaped projections projecting outwardly from the surface of said knife-shaped projections.

25. A process of making a composite article having a copper element bonded to an adhesive material, comprising the steps of
    (a) electrolessly plating a surface of said copper element to form thereon a plated copper layer having a surface with knife-shaped elongate projections;
    (b) oxidizing said plated copper layer; and
    (c) causing said adhesive material to adhere to said oxidized plated copper layer.

26. A process according to claim 25 which further includes the step of
    (d) reducing the oxidized plated copper layer prior to step (c).

27. A process according to claim 25 wherein said surface of said copper element which is electrolessly plated is a surface which has not been subjected to an etching treatment which removes copper therefrom.

28. A process according to claim 26 wherein said electroless plating is performed by means of a plating solution containing an effective amount of oxoacid ions of an element selected from the group comprising Si, Ge, V and C.

29. A process according to claim 28 wherein said plating solution contains a member selected from
    (i) oxoacid ions of Si in a concentration in the range of 25 to 150 mg/l calculated as Si
    (ii) oxoacid ions of Ge in a concentration in the range of 20 to 100 mg/l calculated as Ge
    (iii) oxoacid ions of V in a concentration in the range of 0.2 to 10 mg/l calculated as V
    (iv) oxoacid ions of C in a concentration in the range of 0.05 to 1.5 mol/l calculated as $CO_3^=$.

30. A process according to claim 25 wherein said copper element is a printed circuit layer formed on a substrate.

31. A process of manufacturing a multilayer wiring circuit board comprising the steps of
    (a) forming a plurality of wiring circuit boards each having two main faces and a copper printed circuit layer on at least one main face thereof;
    (b) electrolessly plating each said copper printed circuit layer to form a plated copper layer having a surface with knife-shaped elongate projections thereon;
    (c) oxidizing each said plated copper layer;
    (d) stacking said circuit boards with adhesive material layers between their opposed main faces; and
    (e) causing the adhesive material layers to adhere to the circuit boards and the plated copper layers on the copper printed circuit layers, to form a laminate.

32. A process according to claim 31 further including the step of, after step (c) and prior to step (d), reducing the oxidized plated copper layers on the copper printed circuit layers.

33. A process of manufacturing a multilayer wiring circuit board comprising the steps of
    (a) forming a plurality of wiring circuit boards each having two main faces and a copper printed circuit layer on at least one main face thereof;
    (b) without having etched said copper printed circuit layers electrolessly plating each said copper printed circuit layer to form a plated copper layer having a surface with knife-shaped elongate projections thereon;
    (c) oxidizing each said plated copper layer;
    (d) reducing each said oxidized plated copper layer;
    (e) stacking said circuit boards with adhesive material layers between their opposed main faces; and
    (f) causing the adhesive material layers to adhere to the circuit boards and the plated copper layers on the copper printed circuit layers, to form a laminate, whereby copper wiring layers of said multilayer wiring circuit board having improved acid effervescence, improved adhesion to the adhesive material layer and improve connection reliability.

34. A multi-layer wiring circuit board according to claim 33 for use in a large scale computer capable of high speed signal processing.

* * * * *